(12) United States Patent
Yamashita

(10) Patent No.: US 6,639,233 B2
(45) Date of Patent: Oct. 28, 2003

(54) APPARATUS FOR IMPLANTING AN ION ON A TARGET AND METHOD FOR THE SAME

(75) Inventor: Takatoshi Yamashita, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 10/214,567

(22) Filed: Aug. 9, 2002

(65) Prior Publication Data

US 2003/0030013 A1 Feb. 13, 2003

(30) Foreign Application Priority Data

Aug. 9, 2001 (JP) .................................... P2001-241524

(51) Int. Cl.$^7$ ..................... H01L 21/04; H01J 27/00; H01J 37/317; H01J 37/145
(52) U.S. Cl. .................. 250/492.23; 250/492.1; 250/492.2; 250/492.21; 250/396 R; 250/281; 438/510; 438/514; 438/506; 438/527
(58) Field of Search ................... 250/492.21, 492.1, 250/492.2, 492.23, 396 R, 281

(56) References Cited

U.S. PATENT DOCUMENTS

| | | | | |
|---|---|---|---|---|
| 4,124,802 A | * | 11/1978 | Terasawa et al. | ........ 250/492.2 |
| 5,216,253 A | * | 6/1993 | Koike | ...................... 250/492.2 |
| 5,514,477 A | * | 5/1996 | Ohashi et al. | .............. 428/457 |
| 5,729,409 A | * | 3/1998 | Ohashi et al. | .............. 360/327 |
| 6,087,615 A | * | 7/2000 | Schork et al. | ......... 219/121.43 |
| 6,403,452 B1 | * | 6/2002 | Murakoshi et al. | ......... 438/510 |
| 2002/0130271 A1 | * | 9/2002 | Murakoshi et al. | ......... 250/424 |

* cited by examiner

Primary Examiner—John R. Lee
Assistant Examiner—Bernard E. Souw
(74) Attorney, Agent, or Firm—Finnegan, Henderson, Farabow, Garrett & Dunner LLP

(57) ABSTRACT

An ion implantation apparatus includes an ion source for extracting ions therefrom at an extraction voltage, an acceleration pipe for accelerating the ions thus extracted at an acceleration voltage of $V_A$ and a momentum segregation magnet for selecting the ions having a specific momentum from the ions extracted from the acceleration pipe so that the desired ions are caused to be incident on a target. In the event that $M_I$ denotes the mass number of the desired ions, $Z_I$ denotes the valence thereof, $M_C$ denotes the mass number of noted impurity ions of the impurity ions generated an upstream side of the acceleration pipe, and $Z_C$ denotes the valence thereof, if the relationship that the value of $M_I \cdot (V_E + V_A)/Z_I$ and that of $M_C \cdot V_A/Z_C$ are equal or approximately equal to each other is satisfied, one of the extraction voltage $V_E$ and the acceleration voltage $V_A$ is increased and the other thereof is decreased while the value of $(V_E + V_A)$ is maintained substantially constant.

8 Claims, 2 Drawing Sheets

-Prior Art-

APPARATUS FOR IMPLANTING AN ION ON A TARGET AND METHOD FOR THE SAME

BACKGROUND OF THE INVENTION

1. Field of the Invention

The invention relates to an apparatus and a method for implanting ions on a target, and more particularly relates to the apparatus and the method for preventing impurity ions, which are different from desired ions in at least one of mass number and energy, from being implanted on a target.

2. Description of the Related Art

FIG. 2 shows an example of an ion implantation apparatus of the related art. The ion implantation apparatus includes an ion source 2 having a plasma production chamber 4 for electrostatically extracting ions 8 therefrom, a mass segregation magnet 10 for selectively deriving specific ions (which are specified by a mass number and valence) from the ions 8 extracted from the ion source 2, an acceleration pipe 12 for electrostatically accelerating the ions 8 derived from the mass segregation magnet 10, and a momentum segregation magnet 14 for selectively deriving the ions having a specific momentum (which is specified by a mass number and energy) from the ions 8 derived from the acceleration pipe 12. The ion implantation apparatus is constructed so that only the desired ions derived from the momentum segregation magnet 14 are implanted on a target (e.g. substrate such as a semiconductor wafer) 16.

The target 16 is held on a holder 18 at a ground potential. A scanner for scanning ions 8 and others not shown are usually provided between the momentum segregation magnet 14 and the target 16. A path of the ions 8 from the outlet of the ion source 2 to the holder 18 is included in a vacuum chamber. The vacuum chamber is not shown.

The ion source 2 includes the plasma production chamber 4 for generating plasma and an extraction electrode 6 for extracting the ions 8. The plasma production chamber has a positive potential, and then an extraction voltage $V_E$ applied therebetween from a DC extraction electrode 20. The ions 8 are electrostatically generated from the plasma production chamber 4 by the extraction voltage.

The acceleration pipe 12 has a plurality of electrodes 13. The acceleration pipe 12 has a positive potential, and then a voltage $V_A$ is applied between an inlet and outlet electrode 13 from a DC accelerating power source 22. The ions 8 are electrostatically accelerated by the accelerating voltage $V_A$ so that the ions 8 has target energy.

Assuming that the valence of the desired ions is $Z_I$, the total energy $E_T$ of the desired ions incident on the target 16 is expressed by the following equation.

$$E_T = (V_E + V_A) \times Z_I [eV] \quad \text{[Equation 1]}$$

Since the following phenomenon occurs between the outlet of the mass segregation magnet 10 and the inlet of the acceleration pipe 12, impurity ions which are different from the desired ions may be mixed into the desired ions in the ion implantation apparatus.

(1) The energy accelerated by the acceleration pipe 12 is changed by charging conversion in which the desired ions collide with a residual gas. For example, when doubly charged ions are converted into singly charged ions by the charging conversion, the energy accelerated by the acceleration pipe 12 becomes half of that in the case of the doubly charged ions, if the Voltage $V_A$ is constant.

(2) Where the desired ions are molecular ions, by molecular dissociation, the desired ions change into different ions. For example, when $BF_2$ ions dissociate into BF ions and F ions, or B ions and F ions, the $BF_2$ ions no longer are the desired ions.

(3) A part of the ions 8 collides with the member which constitutes an apparatus such as the vacuum chamber so that atoms or molecules of the member are out of the surface of the member by a sputtering to become impurity ions.

(4) A part of the ions 8 collides with the member which constitutes an apparatus such as the vacuum chamber so that atoms or molecules deposited on or implanted in the member during previous operation of the ion implantation apparatus are out of the member surface by sputtering to become impurity ions.

(5) The gas or vapor used to generating plasma in the plasma production chamber 4 of the ion source 2 flows out from the plasma production chamber 4 into a passage of the ions 8, and then the flown gas or vapor is ionized on the passage to the inlet of the acceleration pipe 12, or otherwise the flown gas or vapor reacts with the atoms or molecules generated owing to the phenomena of the above items (3) and (4) thereby to become impurity ions.

In the ion implantation apparatus, it is not desired that the impurity ions which are different from the desired ions in at least one of mass number and energy are implanted into the target 12 together with the desired ions. Accordingly, a desired implantation characteristic of the target cannot be obtained.

Therefore, when ion implantation with high purity is required as in the example shown in FIG. 2, the momentum segregation magnet 14 as described above as well as the mass number segregation magnet 10 is provided behind the acceleration pipe 12 in order to derive only the ions having a specific momentum selectively.

The momentum segregation magnet 14 permits the impurity ions generated by the phenomena of the above items (1) and (2) to be removed. The impurity ions having a different momentum from that of the desired ions are generated in the phenomena of (1) and (2).

However, in case the impurity ions are generated by the phenomena of the above items (3) to (5), the impurity ions which satisfy the following Equation 2 cannot be separated and removed from the desired ions by means of the momentum segregation magnet 14. This applies to the case where the left side≈the right side in Equation 2 (that means, the left side of the Equation 2 is equal or about equal to the right side thereof). Now it is assumed that $M_T$ denotes the mass number of the desired ions, $Z_I$ denotes the valence thereof, $M_C$ denotes the mass number of the impurity ions at issue, and $Z_C$ denotes the valence thereof. $V_E$ and $V_A$ have been already defined.

$$M_I \cdot (V_E + V_A)/Z_I = M_C \cdot V_A/Z_C$$

Assuming that B is a magnetic flux density, $V_T$ is an entire acceleration voltage, m is a mass, and q is a charge, the circling radius R of the ions in the momentum segregation magnet 14 is expressed by a following Equation 3. Now, assuming that M is the mass number of the ions and $m_P$ is the mass of a proton, $m = M \cdot m_P$. Further, Z is the valence of the ions and e is an electron weight, $q = Z \cdot e$. In short, Equation 3 implies that the ions with the same $M \cdot V_T/Z$ provides the same circling radius R.

$$R = B^{-1}\sqrt{(2mV_{T/q})} \quad \text{[Equation 3]}$$

Therefore, if the above Equation 2 is satisfied, in the momentum segregation magnet 14, the circling radii of the desired ions and impurity ions are equal to each other, both cannot be separated from each other. As a result, even with the momentum segregation magnet 14, the impurity ions as well as the desired ions are implanted into the target 16. This applies to the case where the left side≈the right side of the Equation 2 (that means, the left side of the Equation 2 is equal or about equal to the right side thereof).

A case where the valence $Z_I$ of the desired ions and the valence $Z_C$ of the impurity ions at issue are equal to each other (i.e. where $Z_I = Z_C$) is typical. For example, both are singly charged ions. In this case, the above Equation 2 can be represented by the following equation.

$$M_I \cdot (V_E + V_A) = M_C \cdot V_I \qquad \text{[Equation 4]}$$

If the ion implantation is carried out for the target 16 on the condition of the Equation 4, the desired ions as well as the impurity ions will be implanted into the target 16. This applies to the case where the left side≈the right side (that means, the left side of the Equation 2 is equal or about equal to the right side thereof). Such implantation is not preferable.

It can be supposed that the momentum segregation magnet 14 is served as the mass segregation magnet without providing the mass segregation magnet 10. However, in such a case, the above problem becomes more serious. In case the mass segregation magnet 10 is not present, the impurity ions are generated between the outlet (more particularly, outlet of the extraction electrode 6) and the inlet of the acceleration pipe 12 in this wider range than the above range.

SUMMARY OF THE INVENTION

It is an object of the invention to prevent impurity ions, which are different from desired ions in at least one of mass number and energy from being implanted into a target together with the desired ions.

The method for implanting the desired ion on the target according to this invention is characterized in that if the relationship of Equation 2 is satisfied or in Equation 2, the left side≈right side, one of the extraction voltage $V_E$ and the acceleration voltage $V_A$ is increased and the other thereof is decreased while the value of $(V_E + V_A)$ is substantially constant.

The apparatus for implanting the ion on the target according to the invention is characterized in that it includes a control device for increasing one of the extraction voltage $V_E$ and the acceleration voltage $V_A$ and decreasing the other thereof while maintaining the value of $(V_E + V_A)$ substantially constant and satisfying the Equation 2.

When a voltage to be increased or decreased is represented by $\Delta V$, the above Equation 2 after voltage adjustment is converted into the following Equation 5 or Equation 6. Either method of Equation 5 and Equation 6 may be adopted.

$$M_I \cdot \{(V_E - \Delta V) + (V_A + \Delta V)\}/Z_I \neq M_C \cdot (V_A + \Delta V)/Z_C \qquad \text{[Equation 6]}$$

$$M_I \cdot \{(V_E - \Delta V) + (V_A - \Delta V)\}/Z_I \neq M_C \cdot (V_A - \Delta V)/Z_C \qquad \text{[Equation 6]}$$

In both cases of Equation 5 and Equation 6, the value of the left side and that of the right side are not equal to each other. In this way, as understood from the explanation of the above Equation 3, in the momentum segregation magnet, since the circling radius of the desired ions and that of the noted impurity ions are made different from each other, the impurity ions can be removed by the momentum segregation magnet to derive selectively only the desired ions which are implanted into the target. Namely, it is possible to prevent impurity ions which are different from the desired ions in at least one of their mass number and energy from being implant*ed into the target together with the desired ions.

Further, when the above voltage is adjusted, since the value of $(V_E + V_A)$ which is a sum of the extraction voltage $V_E$ and the acceleration voltage $V_A$ is kept substantially constant, it is not necessary to vary the total energy of the desired ions on the target. For this reason, the initial ion implanting condition of the desired ions can be maintained.

DESCRIPTION OF THE PREFERRED EMBODIMENTS

Figure 1:
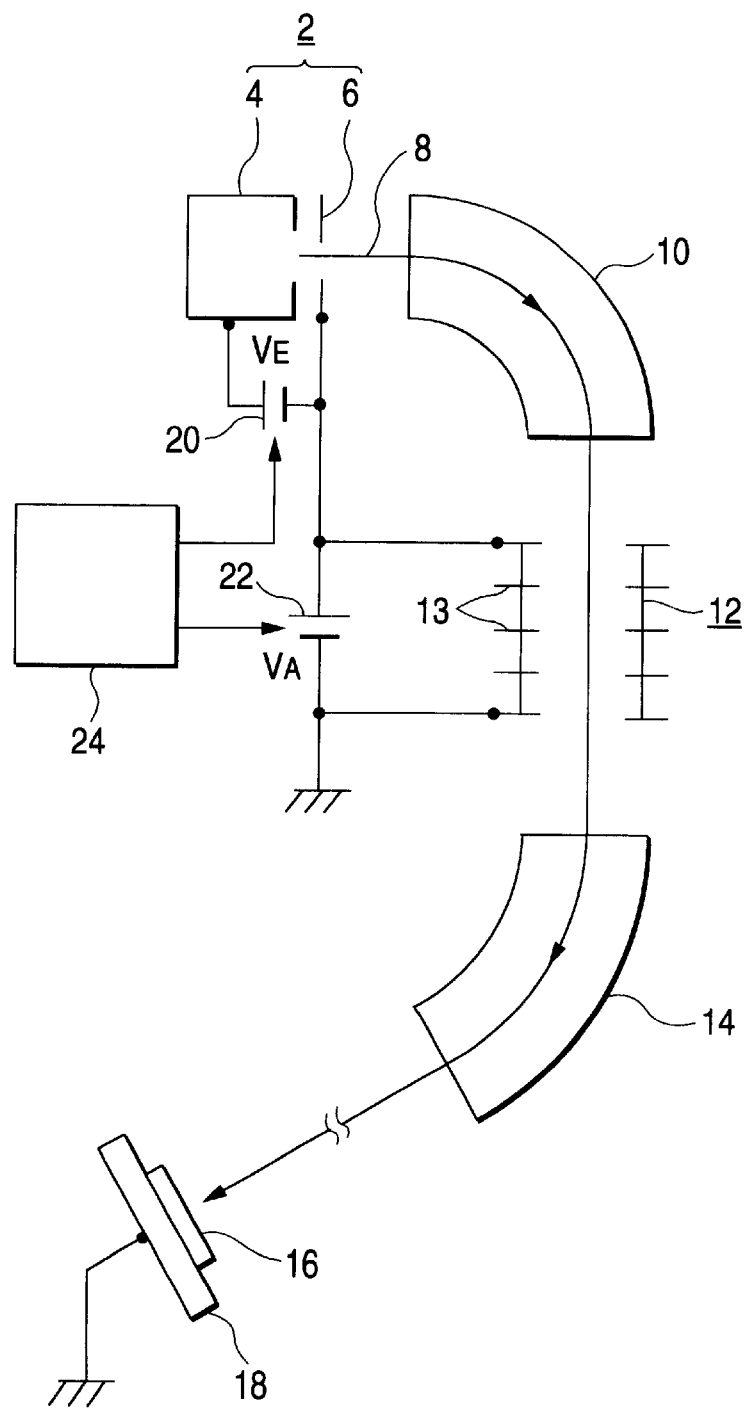
FIG. 1 is a schematic view showing an exemplary ion implantation apparatus for implementing the running method according to this invention.
Figure 2:
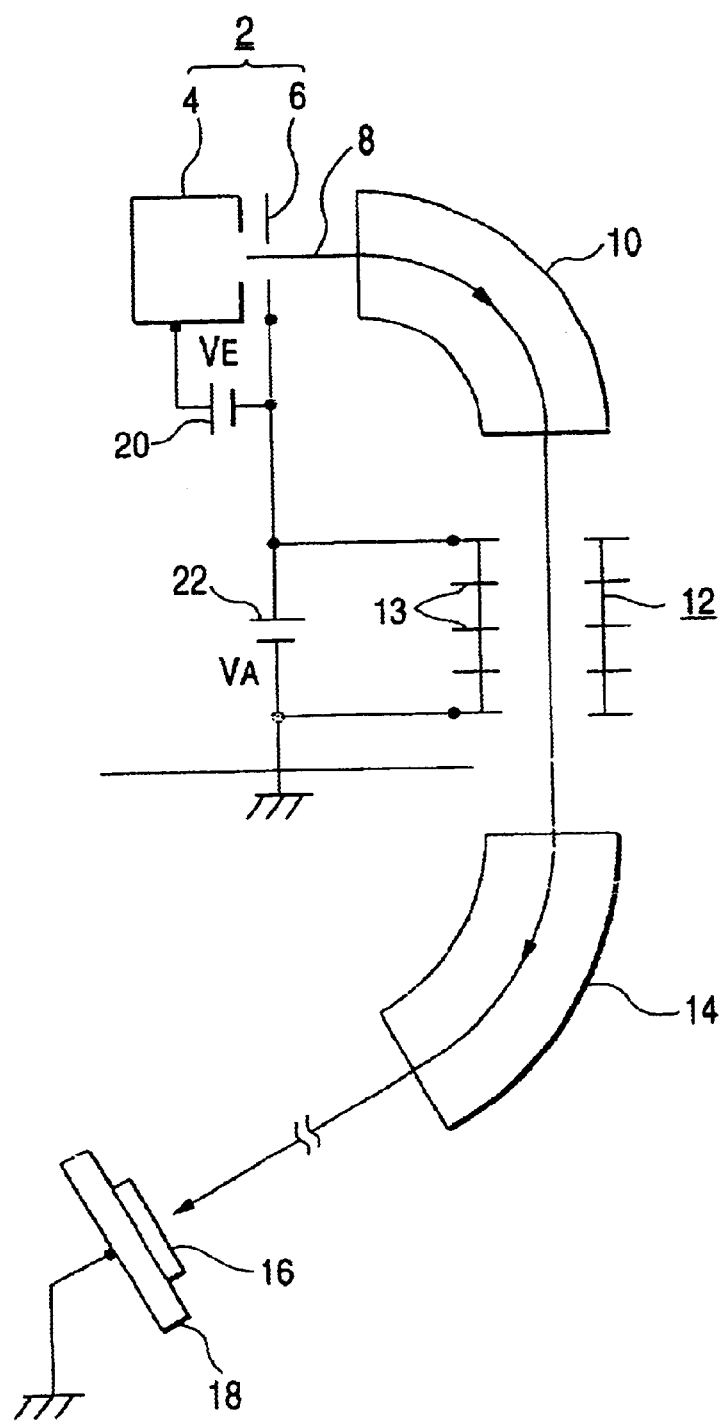
FIG. 2 is a schematic view of an exemplary conventional ion implantation apparatus.

FIG. 1 is a schematic view showing an exemplary ion implantation apparatus for implementing a running method according to this invention. Referring to FIG. 1, with like reference numerals referring to like parts in FIG. 2 showing a prior art, different points of this invention from the prior art will be mainly explained below.

In the ion implantation apparatus, a magnitude of the output voltage produced form each of an extraction power source 20 and an acceleration power source 22 is variable. In the ion implantation, a control device 24 controls the extraction power source 20 and the acceleration power source 22 to increase or decrease the extraction voltage $V_E$ outputted from the extraction power source 20 and the acceleration voltage $V_A$ outputted from the acceleration power source 22.

In this ion implantation apparatus, an explanation will be given of a case where after As ions have been implanted into a target 16 for a long time, desired $BF_2$ ions in place of the As ions are implanted.

Since As ions has been implanted into the target 16 for a long time, a large amount of As atoms or As molecules has been deposited on or implanted in the member such as a vacuum chamber which constitutes the ion implantation apparatus.

In case where desired $BF_2$ ions (mass number of 49) with total energy of 115 keV are implanted on the above-condition. The extraction voltage $V_E$ is 40 kV. The acceleration voltage $V_A$ is 75 kV. As the impurity ions, the As ions (mass number of 75) sputtered owing to the $BF_2$ ions are noted. It is assumed that the valence of $BF_2$ ions and As ions is 1.

In this case, the left side and right side of above Equation 2 (or Equation 4) are represented by the following Equation 7 and Equation 8.

$$\text{The left side} = M_I \cdot (V_E + V_A) = 49 \times (40 + 75) = 5635 \qquad \text{[Equation 7]}$$

$$\text{The right side} = M_C \cdot V_A = 75 \times 75 = 5625 \qquad \text{[Equation 8]}$$

Therefore, if any means is not taken, in Equation 2 (or Equation 4), the left side≈the right side. The difference between both sides is as very small as about 0.2%. Owing to this, the momentum segregation magnet 14 cannot separate the As ions with 75 keV from the $BF_2$ ions with 115 keV so that the As ions will be implanted into the target 16 together with the desired $BF_2$ ions with 115 keV.

In order to avoid the above situation, the above voltage adjustment will be implemented. For example, the voltage $\Delta V$ is set for 10 kV, and the extraction voltage $V_E$ is decreased by 10 kV to be set for 30 kV. The acceleration voltage $V_A$ is increased by 10 kV to be set for 85 kV. This increasing or decreasing method corresponds to the example of Equation 5 described above. Thus, the left side and right side of the above Equation 2 (or Equation 4) can be represented as the following Equation 9 and Equation 10, respectively.

The left side=$M_I \cdot (V_E+V_A)$=49×(30+85)=5635 [Equation 9]

The right side=$M_C \cdot V_A$=75×85=6375 [Equation 10]

As a result, in Equation 2 (or Equation 4), the left side≈the right side. The difference in the value between both sides is about 12%. Therefore, the momentum segregation magnet 14 can sufficiently separate the As ions with 85 keV from the desired $BF_2$ ions with 115 keV. Thus, only the desired $BF_2$ ions can be selectively implanted into the target 16. Additionally, the total energy of the desired $BF_2$ ions remains 115 ekV.

The lower limit of the difference to be given between the left side value and the right side value in Equation 2 (or Equation 4) depends on a resolution of the momentum segregation magnet 14. Therefore, the limit of the difference may be larger than the resolution of the momentum segregation magnet 14. For example, the lower limit is preferably 5% or so. The upper limit is not particularly given. As the difference increases, the separation by the momentum segregation can be easily implemented more easily. However, since the difference is not required to be excessively, actually, for example, the upper limit may be 50%.

In contrast to the above case, as mentioned above, the extraction electrode $V_E$ may be increased by $\Delta V$ and the acceleration voltage $V_A$ may be decreased by $\Delta V$. This increasing or decreasing method corresponds to the example of the above Equation 6.

In this embodiment, the voltage adjustment of increasing or decreasing the extraction voltage $V_E$ and the acceleration voltage $V_A$ as described above can be carried out through the control by the control device 24. However, the voltage adjustment may be carried out by the other means such as manual setting without using the control device 24.

Further, also in the case where the mass segregation magnet 10 is not provided and the momentum segregation magnet 14 is served as the mass segregation magnet, as described above, the method according this invention can be applied to the case. In this case, the impurity ions generated between the outlet of the ion source 2 and the inlet of the acceleration pipe 12 are noted.

As described hitherto, in accordance with this invention, in the momentum segregation magnet, since the circling radius of the desired ions and that of the noted impurity ions are made different from each other, the impurity ions can be removed by the momentum segregation magnet to derive selectively only the desired ions which are implanted into the target. Namely, it is possible to prevent impurity ions which are different from the desired ions in at least one of their mass number and energy from being implanted into the target as well as the desired ions. Further, even when the above voltage adjustment is implemented, since the value of $(V_E+V_A)$ which is a sum of the extraction voltage $V_E$ and the acceleration voltage $V_A$ is kept substantially constant, it is not necessary to vary the total energy of the desired ions incident on the target. For this reason, the initial ion implanting condition by the desired ions can be maintained.

What is claimed is:

1. An apparatus for implanting ions into a target, the apparatus comprising:

an ion source for electrostatically emitting ions at an extraction voltage of $V_E$;

an acceleration device for electrostatically energizing the emitted ions at an acceleration voltage of $V_A$;

a momentum segregation magnet for selectively selecting desired ions having a specific momentum from the emitted ions so that the desired ions selected from the momentum segregation magnet are implanted on the target; and a control device configured for increasing one of the extraction voltage $V_E$ and the acceleration voltage $V_A$ and further configured for decreasing the other of the extraction voltage $V_E$ and the acceleration voltage $V_A$ while keeping the value of $(V_E+V_A)$ substantially constant.

2. The ion implantation apparatus according to claim 1, wherein the control device increases one of the extraction voltage $V_E$ and the acceleration voltage $V_A$ by $\Delta V$ and decreases the other one of the extraction voltage $V_E$ and the acceleration voltage $V_A$ by $\Delta V$ while satisfying a following equation B as follows:

$$M_I \cdot \{(V_E - \Delta V) + (V_A + \Delta V)\}/Z_I \neq M_C \cdot (V_A + \Delta V)/Z_C.$$

3. The ion implantation apparatus according to claim 1, wherein the control device increases one of the extraction voltage $V_E$ and the acceleration voltage $V_A$ by $\Delta V$ and decreases the other of the extraction voltage $V_E$ and the acceleration voltage $V_A$ by $\Delta V$ while satisfying a following equation C as follows:

$$M_I \cdot \{(V_E + \Delta V) + (V_A - \Delta V)\}/Z_I \neq M_C \cdot (V_A - \Delta V)/Z_C.$$

4. A method for implanting ions into a target, comprising the steps of:

a) emitting ions electrostatically at an extraction voltage of $V_E$;

b) energizing the emitted ions electrostatically at an acceleration voltage of $V_A$;

c) selecting desired ions having a specific momentum from the emitted ions so that the desired ions are implanted on the target; and d) increasing one of the extraction voltage $V_E$ and the acceleration voltage $V_A$ and decreasing the other of the extraction voltage $V_E$ and the acceleration voltage $V_A$ while keeping the value of $(V_E+V_A)$ substantially constant with a control device.

5. The method according to claim 4, wherein the control device increases one of the extraction voltage $V_E$ and the acceleration voltage $V_A$ by $\Delta_V$ and decreases the other one of the extraction voltage $V_E$ and the acceleration voltage $V_A$ by $\Delta V$ while satisfying a following equation B as follows:

$$M_I \cdot \{(V_E - \Delta V) + (V_A + \Delta V)\}/Z_I \neq M_C \cdot (V_A + \Delta V)/Z_C.$$

6. The method according to claim 4, wherein the control device increases one of the extraction voltage $V_E$ and the acceleration voltage $V_A$ by $\Delta V$ and decreases the other of the extraction voltage $V_E$ and the acceleration voltage $V_A$ by $\Delta V$ while satisfying a following equation C as follows:

$$M_I \cdot \{(V_E + \Delta V) + (V_A - \Delta V)\}/Z_I \neq M_C \cdot (V_A - \Delta V)/Z_C.$$

7. The ion implantation apparatus according to claim 1, wherein the control device increases one of the extraction voltage and the acceleration voltage and decreases the other of the extraction voltage and the acceleration voltage such that the following equation is satisfied:

$$M_I \cdot (V_E + V_A)/Z_I = M_C \cdot V_A/Z_C$$

wherein $M_I$ and $Z_I$ are the mass and valence of the desired ions and $M_C$ and $Z_C$ are the mass and valence of the impurity ions.

8. The method according to claim 4, wherein the control device increases one of the extraction voltage and the acceleration voltage and decreases the other of the extraction voltage and the acceleration voltage such that the following equation is satisfied:

$$M_I \cdot (V_E + V_A)/Z_I = M_C \cdot V_A/Z_C$$

wherein $M_I$ and $Z_I$ are the mass and valence of the desired ions and $M_C$ and $Z_C$ are the mass and valence of the impurity ions.

* * * * *